United States Patent [19]

Ono et al.

[11] 4,354,130

[45] Oct. 12, 1982

[54] SURFACE ACOUSTIC WAVE DEVICE USING A MULTI-LAYER SUBSTRATE INCLUDING αAL₂O₃, SIO AND ZNO

[75] Inventors: Shusuke Ono, Takatsuki; Tsuneo Mitsuyu, Hirakata; Osamu Yamazaki, Suita; Kiyotaka Wasa, Nara, all of Japan

[73] Assignee: Matsushita Electric Industrial Co., Ltd., Japan

[21] Appl. No.: 213,732

[22] Filed: Dec. 5, 1980

[30] Foreign Application Priority Data

Dec. 19, 1979 [JP] Japan .................................. 54-166104

[51] Int. Cl.³ ............................................. H01L 41/08
[52] U.S. Cl. .................................. 310/313 A; 333/154
[58] Field of Search ........... 310/313 R, 313 A, 313 B, 310/313 C, 313 D; 333/150, 154

[56] References Cited

U.S. PATENT DOCUMENTS 4,037,176  7/1977  Ono et al. ......................... 310/313 B
4,038,615  7/1977  Ishiyama et al. ................ 310/313 B Primary Examiner—Mark O. Budd
Attorney, Agent, or Firm—Wenderoth, Lind & Ponack

[57] ABSTRACT

This invention provides a surface acoustic wave device which comprises a multi-layered substrate. The multi-layered substrate comprises at least a piezoelectric zinc oxide layer, an intermediate silicon oxide layer and an α-Al₂O₃ base made of a single crystal havine an (01$\bar{1}$2) crystallographic plane or an equivalent crystallographic plane. This surface acoustic wave device is operable at ultra-high frequency.

16 Claims, 6 Drawing Figures

SURFACE ACOUSTIC WAVE DEVICE USING A MULTI-LAYER SUBSTRATE INCLUDING αAL₂O₃, SIO AND ZNO

BACKGROUND OF THE INVENTION

This invention relates to a surface acoustic wave device, and more particularly to a composition for a surface acoustic wave device.

Surface acoustic wave devices are obtained by constructing an interdigital electrode on a piezoelectric base. The width of this electrode is proportional to the wavelength ($\lambda$) of the surface acoustic wave. This wavelength ($\lambda$) is determined by the relation $\lambda = v/f$, where v is the propagation velocity of the surface acoustic wave (sound) and f is the frequency of the surface acoustic wave. Therefore, if the frequency (f) is high, the wavelength ($\lambda$) is short, hence the electrode size should be small, which leads to a decrease in the yield rate in the production of such devices. Consequently, bases for surface acoustic wave devices to be used in a high frequency region are desired to propagate sound as rapidly as possible.

Thus far, various kinds of glass, such as fused quartz having a piezoelectric zinc oxide coating layer, have been used as the bases for surface acoustic wave devices. However, in these cases, the propagation velocity of sound is quite low and moreover the effective electromechanical coupling coefficient $K^2$, a fundamental factor decisive of the performance of the devices, cannot have a satisfactory good value.

For example, for a fused quartz base having a zinc oxide layer thereon, the propagation velocity of sound (v) is about 2.7 km/s and the coefficient $K^2$ is about 3%.

A well known material with a high coupling coefficient ($K^2$) value is crystalline LiNbO₃. The $K^2$ value of crystalline LiNbO₃ is at most 5-6% depending on the crystalline orientation. The propagation velocity of sound is at most 4 km/s. However, the frequency temperature coefficient $TC(f)$ ($\equiv (1/f)(\partial f/\partial T)$, where f is a frequency of the surface acoustic wave and T is a temperature), a factor decisive of the performance of a surface acoustic wave device, is $-77$ ppm/°C. and therefore temperature stability is disadvantageously lacking.

On the other hand, as a material propagating sound rapidly, there may be employed a piezoelectric material such as aluminum nitride. For aluminum nitride, the propagation velocity of sound is as high as 6 km/s, and accordingly the corresponding size of the interdigital electrode is relatively large and such electrode can be processed easily. However, formation of an aluminum nitride film is not easy. As another example of such a material, a layered substrate composed of a monocrystalline α-alumina base and a monocrystalline layer of piezoelectric zinc oxide directly and epitaxially grown thereon has thus far been studied. However, for producing the monocrystalline layer, it was necessary to raise the temperature of the base to 500° C. or above, and this presented difficulties in production control and other problems. At temperature below 500° C., the crystallinity was inferior. Moreover, the rate of growth of the crystalline layer is slow and at most 100 Å/min, and therefore the production disadvantageously requires much time.

SUMMARY OF THE INVENTION

The above problems are dissolved by the present invention. Thus, an object of the invention is to provide a surface acoustic wave devices wherein the propagation velocity of sound is high and the electromechanical coupling coefficient is improved.

Another object of the invention is to provide a surface acoustic wave device having improved temperature characteristics.

A further object is to provide a surface acoustic wave devices which exhibits improved characteristics in a high frequency region.

A still further object is to provide a surface acoustic device having a structure suited for mass production.

Other and further objects, features and advantages of the invention will appear more fully from the following description.

In accordance with the present invention, the above objects are achieved with a multi-layered substrate which comprises a piezoelectric zinc oxide layer, an intermediate silicon oxide layer and an α-alumina base. The invention thus provides a surface acoustic wave device which comprises such multi-layered substrate.

DESCRIPTION OF THE PREFERRED EMBODIMENTS

Figure 1:
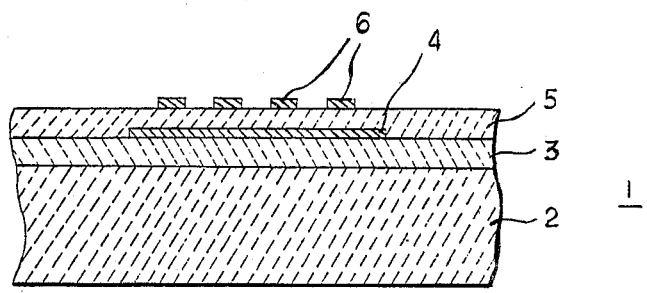
FIG. 1 is a partial cross sectional plane view of the surface acoustic device of the present invention.

Referring to FIG. 1, which cross-sectionally shows a device 1 in accordance with the present invention, a silicon oxide layer 3 formed on an α-alumina single crystal base (i.e. the so-called sapphire base) 2 by vapor deposition, and, on a portion thereof, a short-circuit electrode 4 is formed. The electrode 4 is composed of a metal layer having a sufficiently small thickness as compared with the wavelength $\lambda$. Then, a piezoelectric zinc oxide layer 5 is vapor deposited, and further thereon is disposed an interdigital electrode 6 such that this lies opposite to the above-mentioned short-circuit electrode 4. The piezoelectric zinc oxide layer 5 can be formed with C axis orientation even at relatively low base (substrate) temperatures by the conventional sputtering technique. The silicon oxide layer 3 produces a characteristic effect such that the piezoelectric zinc oxide layer 5 can be formed in the polycrystalline form at a high rate of 100 to 1,000 Å/min at a temperature as low as 150°–200° C. because it is no more influenced by the crystal lattice of the α-alumina base 2.

Figure 2:
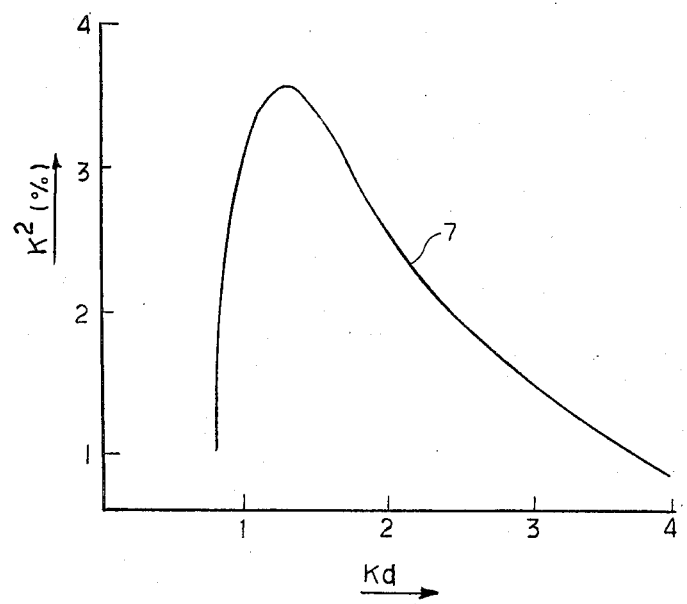
FIG. 2 is a graph showing a relation between the thickness of the piezoelectric zinc oxide layer and the effective electro-mechanical coupling coefficient.
Figure 3:
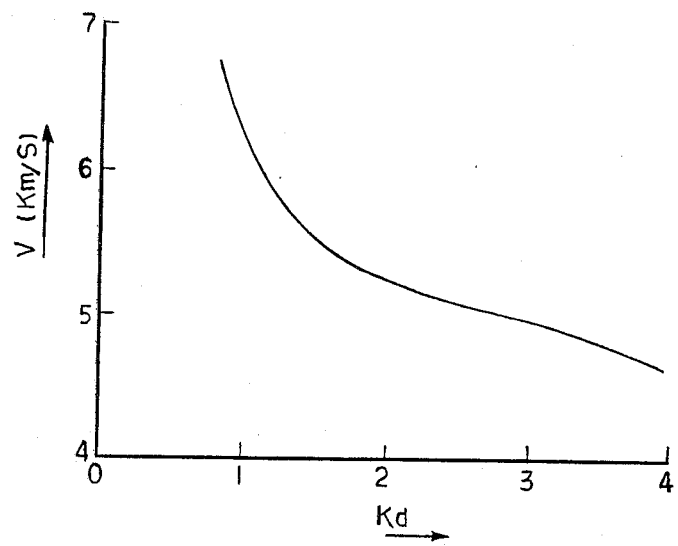
FIG. 3 is a graph showing a relation between the thickness of the piezoelectric zinc oxide layer and the propagation velocity of sound.

Referring to FIG. 2 and FIG. 3, the characteristics of a surface acoustic wave device in which the α-alumina base in the above example is the one having a (01$\bar{1}$2) plane are described in detail, which device is constructed by disposing on said base a silicon oxide layer having a sufficiently small thickness as compared with the wavelength (λ) of the surface acoustic wave, and then disposing thereon in sequence a short-circuit electrode composed e.g. of aluminum, a piezoelectric polycrystalline zinc oxide layer and an interdigital electrode composed e.g. of aluminum. The short-circuit electrode and interdigital electrode are each formed to a thickness of less than about 1/50 of the wavelength so that they may not influence the characteristics of the wave. Among the characteristics of the surface acoustic wave device, important are the effective electro-mechanical coupling coefficient ($K^2$) and propagation velocity of sound (V). Referring to FIG. 2, the curve 7 shows the relationship between the effective electromechanical coupling coefficient ($K^2$) and kd for the case where a surface acoustic wave is propagated in the direction of the <0$\bar{1}$11> axis of the α-alumina base of the above surface acoustic wave device, wherein kd is defined by the equation kd=2πd/λ, where d is the thickness of the piezoelectric zinc oxide layer, λ is the wavelength of the surface acoustic wave and k, a move constant and equal to 2π/λ. Referring to FIG. 3, the curve 8 shows the relationship between the propagation velocity of the surface acoustic wave (V) and kd for the same case as above. From curves 7 and 8, it is seen that, when the thickness of the piezoelectric zinc oxide layer (d) is so adjusted that the condition $0.8 \leq kd \leq 3.7$ is satisfied, the coefficient ($K^2$) and propagation velocity of sound (V) fall within the ranges $3\% \leq K^2 \leq 5.5\%$ and $4.8 \text{ km/s} \leq v \leq 6.7 \text{ km/s}$, respectively. In this way, it is possible to obtain a surface acoustic wave device in which the coefficient $K^2$ is equal to or larger than the coefficient $k^2$ for the aforementioned conventional device comprising a fused quartz base with a piezoelectric zinc oxide layer directly disposed thereon and in which the sound propagation velocity is at least 1.8 times higher than that in the conventional device. When the thickness of the piezoelectric zinc oxide layer (d) is adjusted so that the relation $0.84 \leq kd \leq 2.45$ is satisfied, then a surface acoustic wave device can be obtained in which the $K^2$ value is at least 4/3 times greater and the sound propagation velocity is at least 1.9 times higher as compared with the conventional device. Furthermore, when the thickness of the piezoelectric zinc oxide layer (d) is adjusted so as to satisfy the condition $0.98 \leq kd \leq 1.75$, then there is obtained a very excellent surface acoustic wave device with the coefficient $K^2$ being at least 5/3 times higher and the sound propagation velocity (v) at least 2.0 times higher as compared with the conventional device.

Figure 4:
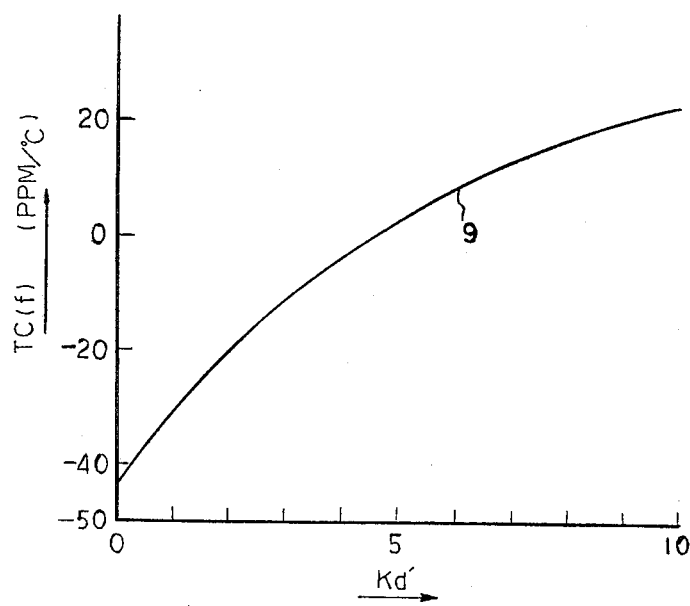
FIG. 4 is a graph showing a relation between the silicon oxide layer thickness and the frequency temperature coefficient.

The frequency temperature coefficient TC(f), an important characteristic for a surface acoustic wave device other than v and $K^2$, is now described in detail. Referring to FIG. 4, the characteristic of a surface acoustic wave device in which the α-alumina base in the embodiment shown in FIG. 1 is the one having a (01$\bar{1}$2) plane is described, which device is constructed by disposing on said base a silicon oxide layer and further disposing thereon a short-circuit electrode, a piezoelectric zinc oxide layer and an interdigital electrode in this order. In FIG. 4, the curve 9 shows the relationship between the frequency temperature coefficient TC(f) and kd' for the case where a surface acoustic wave is propagated in the direction of the <0$\bar{1}$11> axis of the α-alumina base of said surface acoustic wave device and where the zinc oxide layer thickness (d) satisfies the relation kd=1. In FIG. 4, the abscissa is for kd', which is defined by the equation kd'=2πd'/λ, where d' is the silicon oxide layer thickness. From the curve 9, it is seen that, when said layer thickness d' is adjusted so as to satisfy the relations $2 \leq kd' \leq 9$, then $-20 \text{ ppm/°C} \leq TC(f) \leq 20 \text{ ppm/°C}$. In this way, there can be obtained an improved surface acoustic wave device with the temperature coefficient reduced to about ¼ or less as compared with the conventional device. When the silicon oxide layer thickness is adjusted so as satisfy the condition $3.2 \leq kd' \leq 6.3$, then an improved surface acoustic wave device is obtained with the temperature coefficient reduced to about ⅛ or less as compared with the conventional device. Furthermore, when the silicon oxide layer thickness d' is adjusted so as to satisfy the condition $3.9 \leq kd' \leq 5.3$, then a very excellent surface acoustic wave device can be obtained with the frequency temperature coefficient reduced to 1/20 or less as compared with the conventional one. While the above description is directed to the case where the piezoelectric zinc oxide layer thickness d satisfies the condition kd=1, substantially the same effect with respect to said characteristic can be produced when the layer thickness d is in the range $0.8 \leq kd \leq 3.7$.

Figure 5:
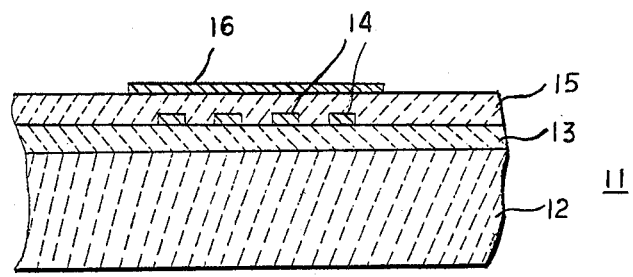
FIG. 5 is a partial cross sectional plane view of an another embodiment of the device of the present invention.

In FIG. 5, there is shown another embodiment of the invention, in which the surface acoustic wave device is constructed by vapor depositing a silicon oxide layer 13 on an α-alumina base 12 having a (01$\bar{1}$2) face, forming an interdigital electrode 14 on a portion of said layer, further vapor depositing thereon a piezoelectric zinc oxide layer 15 and finally disposing thereon a short-circuit electrode 16 composed of a metal film having a sufficiently small thickness as compared with the wavelength λ such that the electrode 16 lies opposite to the above-mentioned interdigital electrode 14.

Figure 6:
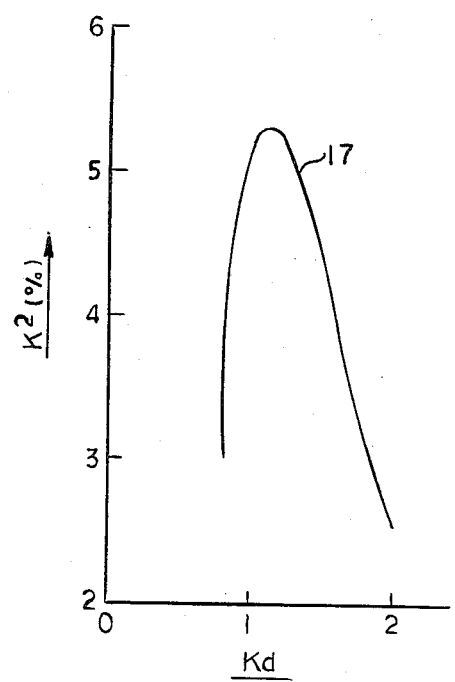
FIG. 6 is a graph showing a relation between the piezoelectric zinc oxide layer thickness and the effective electro-mechanical coupling coefficient for the embodiment shown in FIG. 5.

The surface acoustic wave device 11 is now described in detail. When the silicon oxide layer thickness d' is sufficiently small as compared with the wavelength λ of the surface acoustic wave, the sound propagation velocity v in said device 11 does not show any substantial differences from that in the device 1 shown in FIG. 1 and is almost identical with the value given by the curve 8 in FIG. 3. On the other hand, the effective electromechanical coupling coefficient $K^2$ is shown by the curve 17 in FIG. 6. From the curves 8 and 17, it is seen that, when the thickness of the piezoelectric zinc oxide layer (d) is adjusted so as to satisfy the condition $0.8 \leq kd \leq 1.85$, then the coefficient $K^2$ and sound propagation velocity v for the device 11 fall within the ranges $3\% \leq K^2 \leq 5.3\%$ and $5.3 \text{ km/s} \leq v \leq 6.7 \text{ km/s}$, respectively. In this manner, there can be obtained a surface acoustic wave device equal or superior in respect of the coefficient $K^2$ to the previously mentioned conventional device comprising a fused quartz base with a piezoelectric zinc oxide layer directly disposed thereon; also the sound propagation velocity is at least 2 times higher as compared with the conventional device. When the piezoelectric zinc oxide layer thickness d is adjusted so as to satisfy the condition $0.84 \leq kd \leq 1.58$, then an improved surface acoustic wave device is obtained with the coefficient $K^2$ being at least 4/3 times greater and the sound propagation velocity as least 2.0 times higher as compared with the conventional device. Furthermore, when the piezoelectric zinc oxide layer thickness is adjusted so as to satisfy the condition $0.95 \leq kd \leq 1.30$, then an excellent surface acoustic wave device is obtained with the coefficient $K^2$ being at least 5/3 times greater and the sound propagation velocity at least 2.1 times higher as compared with the conventional device.

Moreover, when the zinc oxide layer thickness d satisfies the relation $kd=1$, the frequency temperature coefficient TC(f) for the surface acoustic wave device 11 shown in FIG. 5 is substantially the same as the value given by the curve 9 in FIG. 4. Also when the zinc oxide layer thickness d is in the range $0.8 \leq kd \leq 1.85$, substantially the same effect is produced.

In each of the foregoing examples, mention has been made of the characteristics for the case where the α-alumina base has a $(01\bar{1}2)$ plane. However, also when some other plane crystallographically equivalent to said plane, such as a $(10\bar{1}2)$ plane, is used, substantially the same effect is obtained.

While in each of the above examples description has been given of the characteristics for the case where the direction of propagation of the surface acoustic wave is identical with the direction of the $<0\bar{1}11>$ axis of the α-alumina base, substantially the same effect can be produced also when the wave is propagated in the direction of an axis crystallographically equivalent to said axis, such as the $<01\bar{1}\bar{1}>$ axis. Even when the surface acoustic wave is propagated in a direction other than the $<0\bar{1}11>$ and $<01\bar{1}\bar{1}>$ axes in each of the above examples in which the α-alumina base has a $(01\bar{1}2)$ face, substantially the same effect can be obtained as for the case of propagation in the direction of the $<0\bar{1}11>$ of $<0111>$ axis. Thus, for example, it has been found that, when the surface acoustic wave is propagated in a direction making an angle of 50° with the $<0\bar{1}11>$ axis, the coefficient $K^2$ is reduced by about 0.3% and the sound propagation velocity by about 1% as compared with the case of propagation in the direction of the $<0\bar{1}11>$ axis. Therefore, while propagation of the surface acoustic wave in the direction of the $<0\bar{1}11>$ axis of the α-alumina base gives the maximum effective electro-machanical coupling coefficient and sound propagation velocity values, no problems arise from the practical viewpoint even in the case of propagation in other axial directions. Whereas, in each of the foregoing examples, the piezoelectric zinc oxide layer is polycrystalline and of C axis orientation, hence the normal direction to the α-alumina base is identical with the direction of the $<0001>$ axis of the polycrystalline base, it has also been found that substantially the same characteristics can be obtained if the angle between the direction of said $<0001>$ axis and the direction normal to the α-alumina base is less than 10°.

As is clear from the foregoing description, the surface acoustic wave device of the present invention has a large effective electro-mechanical coupling coefficient value, makes high velocity sound propagation possible, and moreover is excellent in characteristics in a high frequency region as well as in temperature characteristics and therefore can find a wide range of application. The device of the invention also has many other advantages from the industrial viewpoint, such as the fact that the electrode processing in the manufacture of surface acoustic wave devices for use in high frequency regions is facilitated and that the time required for forming piezoelectric zinc oxide layers can be reduced.

What is claimed is:

1. A surface acoustic wave device comprising a multi-layered substrate, in which said multi-layered substrate comprises at least, in the following order, an α-Al$_2$O$_3$ single crystal base made of a single crystal having an $(01\bar{1}2)$ crystallographic plane or a crystallographically equivalent plane, an intermediate silicon oxide layer, a metal film, a piezoelectric zinc oxide layer and an interdigital electrode, the thickness of said metal film being very much smaller than λ and said zinc oxide layer having a layer thickness which ranges from 0.8/k to 3.7/k, where k is a wave constant equal to $2\pi/\lambda$, λ being the wavelength of said surface acoustic wave.

2. A surface acoustic wave device as claimed in claim 1, in which the layer thickness of said zinc oxide layer ranges from 0.84/k to 2.45/k.

3. A surface acoustic wave device as claimed in claim 1, in which the layer thickness of said zinc oxide layer ranges from 0.98/k to 1.75/k.

4. A surface acoustic wave device as claimed in claim 1, in which the layer thickness of said silicon oxide layer ranges from 2/k to 9/k.

5. A surface acoustic wave device as claimed in claim 1, in which the layer thickness of said silicon oxide layer ranges from 3.2/k to 6.3/k.

6. A surface acoustic wave device as claimed in claim 1, in which the layer thickness of said silicon oxide layer ranges from 3.9/k to 5.3/k.

7. A surface acoustic wave device as claimed in claim 1 in which a propagation direction of said surface acoustic wave is parallel to a $<0\bar{1}11>$ crystallographic axis of said α-Al$_2$O$_3$ base or one of the crystallographically equivalent axes.

8. A surface acoustic wave device as claimed in claim 7, in which said zinc oxide layer has polycrystalline form and an angle between the $<0001>$ axis of said polycrystalline and the normal direction of said α-Al$_2$O$_3$ base is less than 10°.

9. A surface acoustic wave device comprising a multi-layered substrate, in which said multi-layered substrate comprises at least, in the following order, an α-Al$_2$O$_3$ single crystal base having an $(01\bar{1}2)$ crystallographic plane or a crystallographically equivalent plane, an intermediate silicon oxide layer, an interdigital electrode, a piezoelectric zinc oxide layer and a metal film, the thickness of said metal film being very much smaller than λ and said zinc oxide layer having a layer thickness which ranges from 0.8/k to 1.85/k, where k is a wave constant equal to $2\pi/\lambda$, λ being the wavelength of said surface acoustic wave.

10. A surface acoustic wave device as claimed in claim 9, in which the layer thickness of said zinc oxide layer ranges from 0.84/k to 1.58/k.

11. A surface acoustic wave device as claimed in claim 9, in which the layer thickness of said zinc oxide layer ranges from 0.95/k to 1.30/k.

12. A surface acoustic wave device as claimed in claim 9, in which the layer thickness of said silicon oxide layer ranges from 2/k to 9/k.

13. A surface acoustic wave device as claimed in claim 9, in which the layer thickness of said silicon oxide layer ranges from 3.2/k to 6.3/k.

14. A surface acoustic wave device as claimed in claim 9, in which the layer thickness of said silicon oxide layer ranges from 3.9/k to 5.3/k.

15. A surface acoustic wave device as claimed in claim 9, in which a propagation direction of said surface acoustic wave is parallel to a (0111) crystalographic axis of said α-Al$_2$O$_3$ base or one of the crystallographically equivalent axes.

16. The surface acoustic wave device as claimed in claim 15, in which said zinc oxide layer has polycrystalline form and an angle between the (0001) axis of said polycrystalline and the normal direction of said α-Al$_2$O$_3$ base is less than 10°.

* * * * *